United States Patent [19]

Lee

[11] Patent Number: 5,792,671
[45] Date of Patent: Aug. 11, 1998

[54] METHOD OF MANUFACTURING SEMICONDUCTOR DEVICE

[75] Inventor: Byoung Ju Lee, Seoul, Rep. of Korea

[73] Assignee: LG Semicon Co., Ltd., Chungcheongbuk-Do, Rep. of Korea

[21] Appl. No.: 606,186

[22] Filed: Feb. 23, 1996

[30] Foreign Application Priority Data

Dec. 19, 1995 [KR] Rep. of Korea ............... 52203/1995

[51] Int. Cl.⁶ .................................................. H01L 21/265
[52] U.S. Cl. .............................. 437/44; 437/40; 437/41; 437/228; 437/204; 437/180
[58] Field of Search ........................... 437/405 W, 415 W, 437/204, 189, 180, 228 SW, 228 CON, 44

[56] References Cited

U.S. PATENT DOCUMENTS 4,736,233  4/1988  McDavid.
4,906,591  3/1990  Okumura.
5,063,168  11/1991 Vora ............................... 437/228
5,290,720  3/1994  Chen ............................... 437/41
5,312,768  5/1994  Gonzalez ........................ 437/40

FOREIGN PATENT DOCUMENTS 55-0052264  4/1980  Japan ............................ 437/41
62-0051261  3/1987  Japan ............................ 437/40

Primary Examiner—Trung Dang
Attorney, Agent, or Firm—Finnegan, Henderson, Farabow, Garrett & Dunner, L.L.P.

[57] ABSTRACT

A method of manufacturing a semiconductor device includes the steps of providing a semiconductor substrate; forming a gate electrode on the substrate; forming impurity regions on both sides of the gate electrode; forming a first sidewall on the side of the gate electrode; forming a second sidewall on the side of the first sidewall; forming a third sidewall on the side of the second sidewall; and selectively removing only the second sidewall to thereby form a contact area. It is possible to precisely form a fine contact area so that the size of a semiconductor device can be reduced.

22 Claims, 4 Drawing Sheets

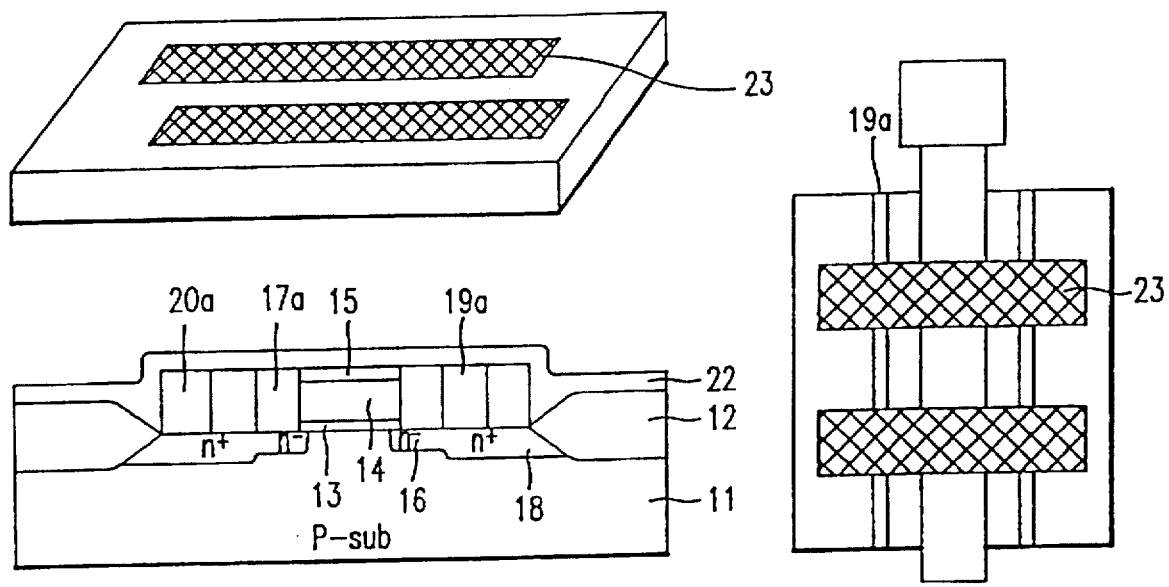
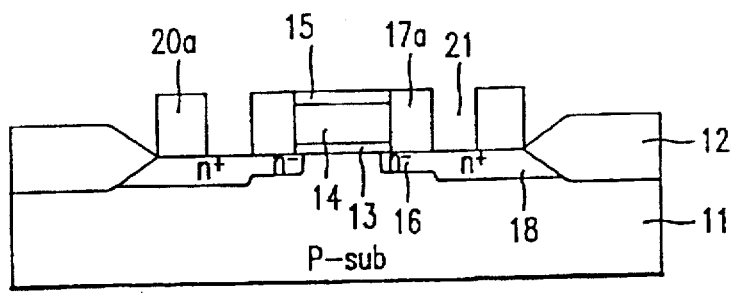
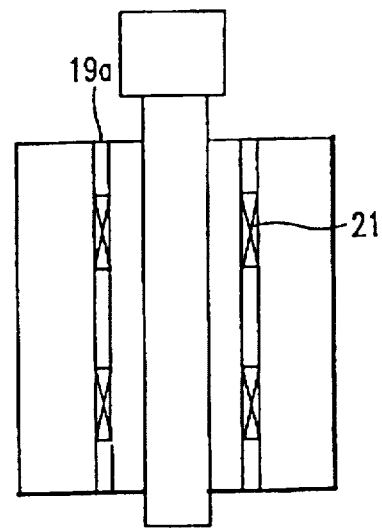

METHOD OF MANUFACTURING SEMICONDUCTOR DEVICE

BACKGROUND OF THE INVENTION

Field of the Invention

The present invention relates to a method of manufacturing a semiconductor device, and more particularly, to a method incorporating self-aligning technology in the manufacture of a highly integrated semiconductor device having a fine contact area.

In general, the integration, packing density, and performance of semiconductor devices have increased approximately four-fold every three years. Since such increases generally accompany size reduction of semiconductor devices, coinciding improvements in yield and reliability are required. In order to meet these requirements, it is necessary to minimize the use of conventional mask processes, which do not have a high degree of accuracy or reliability. When conventional mask processes are used, misalignment is not uncommon. The deleterious effects of misalignment become more significant as the sizes of the devices become smaller. In order to alleviate these problems, self-aligning technology may be used to simply and accurately form fine patterns.

FIGS. 1a to 1e are cross-sectional views illustrating a conventional method of manufacturing a semiconductor device.

As shown in FIG. 1a, a first insulating film 3, a polycrystalline silicon 4 and a second insulating film 5 are sequentially deposited on a P-type semiconductor substrate 1, divided into a field region and an active region by a field oxide film 2. Using a photo-lithography and etching process, portions of the first insulating film 3, polycrystalline silicon 4, and second insulating film 5 are selectively removed to form a polycrystalline silicon gate electrode 4. In order to form source and drain regions of low concentration, dispersed N-type impurity ions are implanted into the P-type semiconductor substrate using self-aligning technology, i.e., the gate electrode 4 acts as a mask, thereby forming low concentration N-type impurity regions 6 in the P-type semiconductor substrate 1 on both sides of the gate electrode 4.

As shown in FIG. 1b, a third insulating film 7 is formed over the entire surface of the P-type semiconductor substrate 1, including gate electrode 4.

As shown in FIG. 1c, the third insulating film 7 is anisotropically etched, thereby forming insulating film sidewalls 7a on the sides of gate electrode 4.

The self-aligning technology uses gate electrode 4 and insulating film sidewalls 7a as masks, enabling a high concentration of N-type impurity ions to be precisely implanted into P-type semiconductor substrate 1 of the active region, thereby forming high concentration N-type impurity regions 8 in P-type semiconductor substrate 1 beyond insulating film sidewalls 7a.

As shown in FIG. 1d, a fourth insulating film 9 is formed on the entire surface of P-type semiconductor substrate 1 including gate electrode 4 and insulating film sidewalls 7a.

As shown in FIG. 1e, fourth insulating film 9 above the high concentration N-type impurity region is selectively etched using the photo-lithography and etching process, thereby forming a contact area (window in insulating film 9).

There are problems, however, with this conventional method of manufacturing semiconductor devices. For example, since the contact area is formed by photolithography and etching, it is difficult to form a fine contact area or window (e.g., less than 0.25 μm) on semiconductor devices requiring high integration.

Moreover, when photolithography is used, the performance or yield of the device is deteriorated due to mask misalignment.

SUMMARY OF THE INVENTION

In order to solve the aforementioned problems, it is an object of the present invention to provide a method of manufacturing a semiconductor device wherein a fine contact window is formed using the self-aligning method.

To accomplish the objects of the present invention, there is provided a method of manufacturing a semiconductor device, comprising the steps of providing a semiconductor substrate; forming a gate electrode on the substrate; forming impurity regions on both sides of the gate electrode; forming a first sidewall on the side of the gate electrode; forming a second sidewall on the side of the first sidewall; forming a third sidewall on the side of the second sidewall; and selectively removing only the second sidewall to form a contact area.

BRIEF DESCRIPTION OF THE DRAWINGS

FIGS. 3a through 3e are cross-sectional views illustrating a manufacturing process and layout diagram of a semiconductor device, according to a second embodiment the present invention.

DETAILED DESCRIPTION OF THE INVENTION

Hereinafter, a method of manufacturing a semiconductor device according to the present invention will be described with reference to the attached drawings.

Figure 1A:
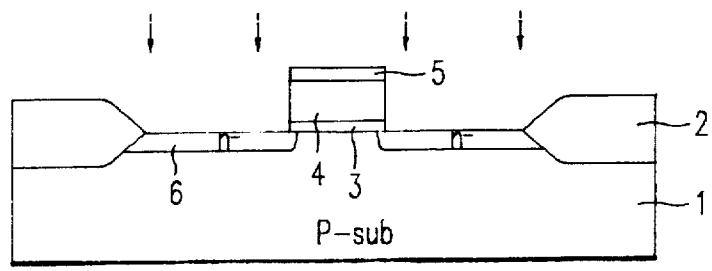
FIGS. 1a to 1e are cross-sectional views illustrating a conventional method of manufacturing a semiconductor device.
Figure 1B:
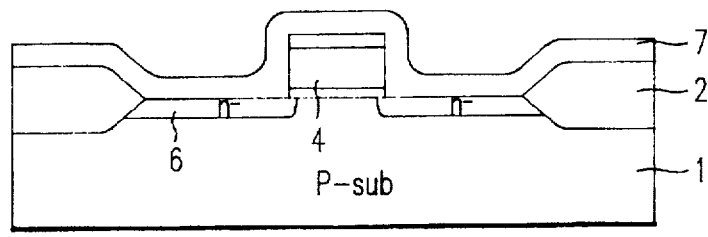
Figure 1C:
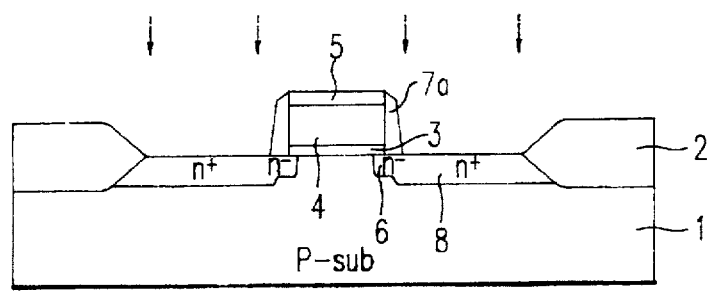
Figure 1D:
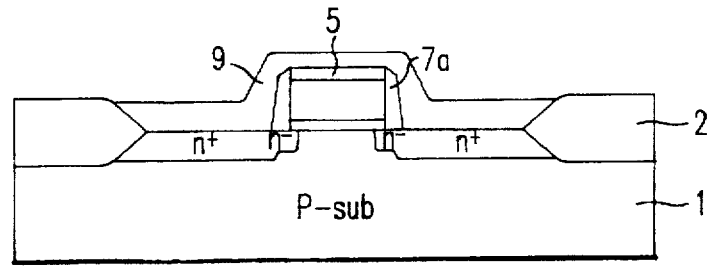
Figure 1E:
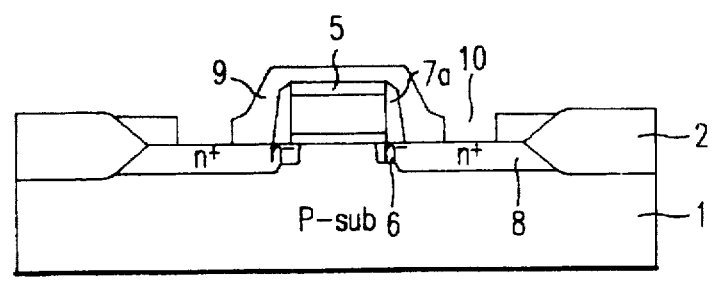
Figure 2A:
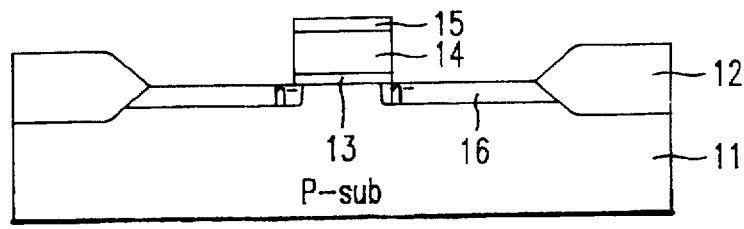
FIGS. 2a to 2h are cross-sectional views illustrating a method of manufacturing a semiconductor device according to a first embodiment of the present invention.

As shown in FIG. 2a, a first insulating film (gate insulating film) 13, a polycrystalline silicon layer 14 and a second insulating film (cap gate insulating film) 15 are sequentially deposited on a P-type semiconductor substrate 11 divided into a field region and an active region by a field oxide film 12. First and second insulating films 13 and 15 and the polycrystalline silicon layer are selectively removed to form a polycrystalline silicon gate electrode 14. Preferably, this step is performed using a photolithography and etching process.

Using self-aligning technology, gate electrode 14 acts as a mask and dispersed N-type impurity ions are implanted into P-type semiconductor substrate 11 of the active region, thereby forming low concentration N-type impurity regions 16 in P-type semiconductor substrate 11 on both sides of gate electrode 14.

Figure 2B:
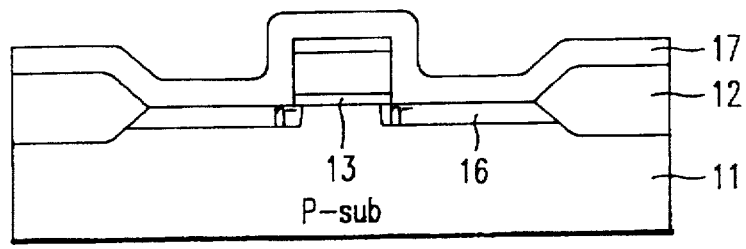

As shown in FIG. 2b, a third insulating film 17 is formed on the entire surface of P-type semiconductor substrate 11 including gate electrode 14.

Figure 2C:
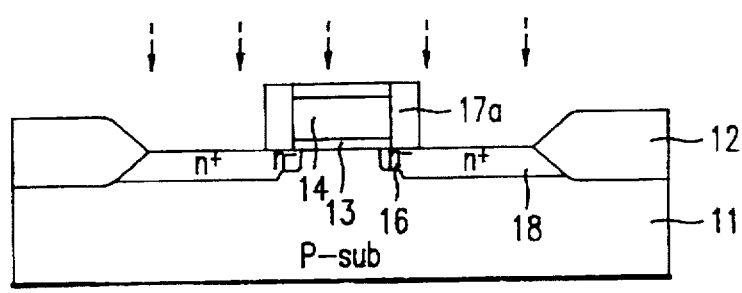

As shown in FIG. 2c, third insulating film 17 is substantially removed, leaving only first sidewalls 17a covering the sides of gate 4. Preferably, the film is etched using a reactive ion etching (RIE) method.

Using the self-aligning technology in which both gate electrode 14 and first sidewall 17a act as masks, highly concentrated N-type impurity ions are implanted into P-type semiconductor substrate 11 of the active region, thereby forming high concentration N-type impurity regions 18 outwardly of first sidewall 17a.

Figure 2D:
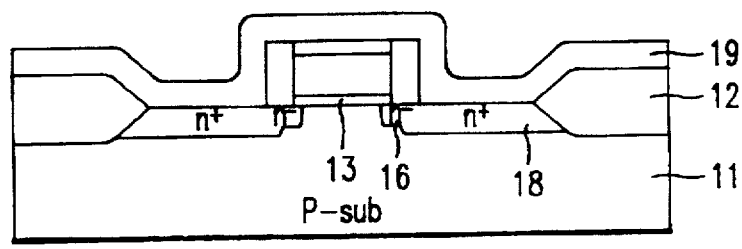

As shown in FIG. 2d, a fourth insulating film 19 is formed on the entire surface of P-type semiconductor substrate 11 including gate electrode 14 and first sidewall 17a.

Figure 2E:
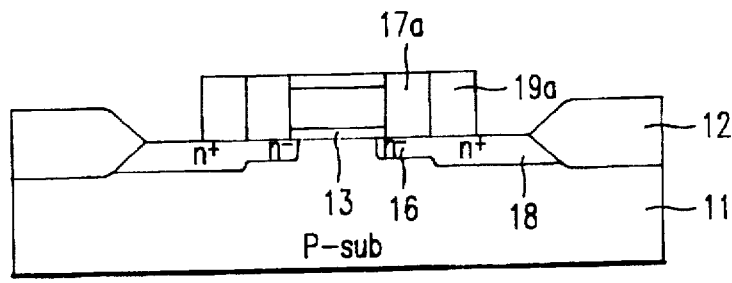

As shown in FIG. 2e, fourth insulating film 19 is substantially removed, leaving only a second sidewall 19a covering the outer side of first sidewall 17a. Preferably the film is etched using a RIE method.

Figure 2F:
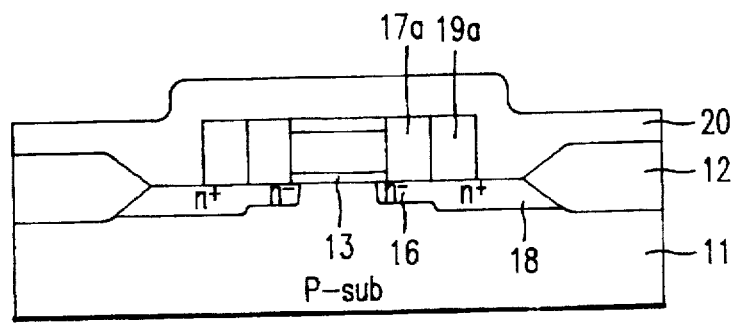

As shown in FIG. 2f, a fifth insulating film 20 is formed on the entire surface of P-type semiconductor substrate 11 including gate electrode 14 and first and second sidewalls 17a and 19a.

Figure 2G:
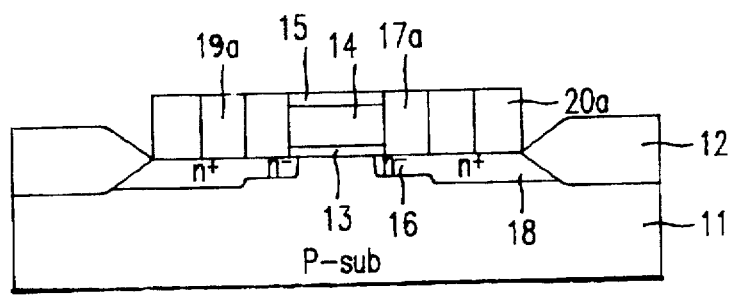

As shown in FIG. 2g, fifth insulating film 20 is substantially removed, leaving only a third sidewall 20a covering the outer side of second sidewall 19a. Preferably, the film is etched using the RIE method.

The etch selectivity of the second sidewall 19a is different from the other sidewalls 17a and 20a. For example, if the other sidewalls are oxide films (e.g., $SiO_2$), a silicon nitride film ($Si_3N_4$) may be used as second sidewall 19a.

Figure 2H:
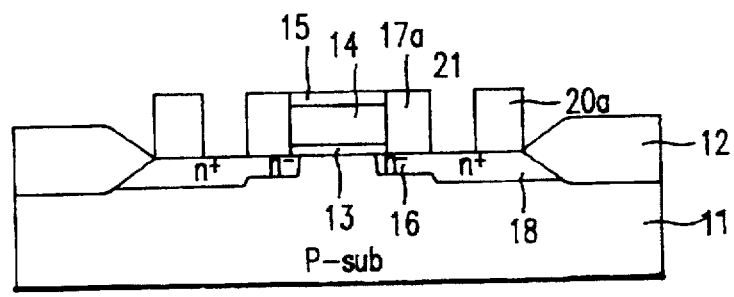

As shown in FIG. 2h, using the self-aligning technology in which gate electrode 14 and first and third sidewalls 17a and 20a act as masks, second sidewall 19a is selectively removed, preferably by wet etching, thereby forming a contact window 21 exposing the upper side of the high concentration N-type impurity region at the substrate surface.

By using this process of the invention, a single contact window can be formed in a transistor of small channel width, for example.

FIGS. 3a and 3b are cross-sectional views illustrating a manufacturing process and layout diagram of a semiconductor device according to a second embodiment the present invention. A method of forming a plurality of contact windows in a transistor of large channel width is shown in FIG. 3.

As shown in FIG. 3a, a photoresist film 22 is coated on the entire surface of P-type semiconductor substrate 11 including gate electrode 14 and first, second and third sidewalls 17a, 19a and 20a. Then photoresist film 22 is exposed and developed using a contact mask 23.

As shown in FIG. 3b, second sidewall 19a is selectively removed, preferably using the wet etching process, thereby forming a plurality of contact windows 21.

Since the plurality of contact windows 21 are formed by the self-aligning method using a rough mask (a mask wherein dimensional and alignment accuracy are unnecessary), contact margin is good.

Several advantages may be realized by practicing the method of manufacturing a semiconductor device of the present invention as described above.

For example, since the contact area is formed by using the self-aligning method, it is possible to form accurately positioned, fine contact windows or areas.

Moreover, the size of the contact window can be controlled by controlling the thickness of the insulating film on those portions where a contact area will be formed.

Further, since fine contact window can be formed accurately, the size of the semiconductor device can be reduced.

What is claimed is:

1. A method of manufacturing a semiconductor device, comprising the steps of:
   providing a semiconductor substrate;
   forming a gate electrode on said substrate;
   forming impurity regions on both sides of said gate electrode;
   forming a first sidewall on the side of said gate electrode;
   forming a second sidewall on the side of said first sidewall;
   forming a third sidewall on the side of said second sidewall; and
   selectively removing said second sidewall to thereby form a contact area between said first and third sidewalls.

2. The method of claim 1, wherein said second sidewall has a different etch selectivity than said first and third sidewalls.

3. A method of manufacturing a semiconductor device, comprising the steps of:
   providing a semiconductor substrate;
   forming a gate electrode on said substrate;
   forming impurity regions on both sides of said gate electrode;
   forming a first sidewall on the side of said gate electrode;
   forming a second sidewall on the side of said first sidewall;
   forming a third sidewall on the side of said second sidewall; and
   selectively removing said second sidewall to form a plurality of contact areas.

4. The method of claim 3, wherein:
   said plurality of contact areas are formed by positioning a contact mask over predetermined areas of a photoresist film formed on the entire surface of said semiconductor substrate including said gate electrode and first, second, and third sidewalls; and
   exposing and developing portions of said photoresist film.

5. A method for making a contact hole comprising the steps of:
   forming a first insulative layer on a surface of a substrate;
   patterning said first insulative layer to form a portion of said first insulative layer on said substrate while exposing a first region of said surface of said substrate;
   forming a second insulative layer on said first region of said substrate and said portion of said first insulative layer;
   patterning said second insulative layer to form a portion of said second insulative layer on said substrate adjacent said portion of said first insulative layer, while exposing a second region of said surface of said substrate and a top surface of said portion of said first insulative layer;
   forming a third insulative layer on said second region of said surface of said substrate and said portions of said first and second insulative layers;
   patterning said third insulative layer to form a portion of said third insulative layer adjacent said portion of said second insulative layer, while exposing a top surface of said portion of said second insulative layer and said top surface of said portion of said first insulative layer; and
   selectively removing said portion of said second insulative layer while leaving said portions of said first and third insulative layer to thereby expose a third region of said surface of said substrate between said portions of said first and third insulative layers to hereby provide said contact hole.

6. A method of making a contact hole in accordance with claim 5, wherein said second insulative layer has a etching selectivity different than that of said first and third insulative layers.

7. A method of making a contact hole in accordance with claim 5, wherein said first and third insulative layers include silicon nitride and said second insulative layer includes silicon dioxide.

8. A method of making a contact hole in accordance with claim 5, wherein said steps of patterning said first, second and third insulative layers further include respective steps of anisotropically etching said first, second and third insulative layers.

9. A method of making a contact hole in accordance with claim 8, wherein said steps of anisotropically etching said first, second and third insulative layers include steps of etching said first, second and third layers by reactive ion etching.

10. A method of making a contact hole in accordance with claim 5, wherein said selectively removing step includes a wet etching step.

11. A method of manufacturing a semiconductor device comprising the steps of:

forming an insulative gate on a surface of a semiconductor substrate, said insulative gate having a sidewall;

forming a first insulative sidewall spacer on said sidewall of said insulated gate and on a first portion of said surface of said semiconductor substrate;

forming a second insulative sidewall spacer on a side portion of said first insulative sidewall spacer and on a second portion of said surface of said semiconductor substrate, such that said first insulative sidewall spacer is sandwiched between said insulated gate sidewall and said second insulative sidewall spacer;

forming a third insulative sidewall spacer on a side portion of said second insulative sidewall spacer and on a third portion of said surface of said semiconductor substrate, such that said second insulative sidewall spacer is sandwiched between said first and third insulative sidewall spacers; and selectively removing said second insulative sidewall spacer to expose said second portion of said surface of said semiconductor substrate, while leaving said first and third insulative sidewall spacers covering said first and third portions, respectively, of said surface of said semiconductor substrate.

12. A method in accordance with claim 11, wherein said step of forming said first insulative sidewall spacer includes the steps of:

depositing a first insulative layer on said substrate and on a top surface of said insulated gate; and etching said first insulative layer to expose said second and third substrate portions and said top surface of said insulated gate while leaving said first insulative sidewall spacer on said first substrate surface portion, said step of forming said second insulative sidewall spacer includes the steps of:

depositing a second insulative layer on said second and third substrate surface portions, on said top surface of said insulated gate, and on a top surface of said first insulative sidewall spacer; and etching said second insulative layer to expose said third substrate surface portion, said top surface of said insulated gate, and said top surface of said first insulative sidewall, said step of forming said third insulative sidewall includes the steps of:

depositing a third insulative layer on said third substrate surface portion, on said top surface of said insulated gate, said top surface of said first insulative sidewall, and a top surface of said second insulative sidewall; and etching said third insulative layer to expose said top surface of said insulated gate, said top surface of said first insulative sidewall, and said top surface of said second insulative sidewall.

13. A method in accordance with claim 11, wherein said second insulative sidewall spacer includes material having a etching selectivity that is different than that of said first and third insulative sidewalls.

14. A method in accordance with claim 11, wherein said selectively removing step includes a wet etch step.

15. A method in accordance claim 12, wherein said steps of etching said first, second and third insulative layers include anisotropic etching steps.

16. A method in accordance with 15, wherein said anisotropic etch steps include reactive ion etching steps.

17. A method in accordance with claim 11, wherein said second insulative sidewall spacer has a etching selectivity different than that of said first and third insulative sidewall spacers.

18. A method in accordance with claim 11, wherein said first and third insulative sidewall spacers include silicon nitride, and said second insulative sidewall spacer includes silicon oxide.

19. A method for manufacturing a semiconductor device comprising the steps of:

forming an insulated gate on a surface of a substrate;

sequentially forming first, second and third sidewall spacers adjacent a side surface of said insulated gate and overlying first, second and third portions, respectively, of said surface of said substrate;

depositing a layer of photoresist on top surfaces of said first, second and third sidewall spacers and said insulated gate;

developing said photoresist to expose a top portion of said second insulative sidewall spacer corresponding to a pattern; and etching said exposed top portion of said second insulative sidewall spacer to thereby expose said second portion of said surface of said substrate.

20. A method in accordance with claim 19, wherein said exposing step includes the steps of:

placing a photomask having transparent portions corresponding to said pattern in contact with said layer of photoresist; and exposing said layer of photoresist through said transparent portions of said photomask.

21. A method in accordance with claim 19, wherein said etching step includes a wet etch step.

22. A method for manufacturing a semiconductor device, comprising the steps of:

forming an insulated gate on a surface of a substrate;

sequentially forming first, second and third sidewall spacers adjacent a side surface of said insulated gate, said first, second and third sidewall spacers overlying first, second and third portions, respectively of said surface of said substrate; and selectively removing said second insulative sidewall spacer to thereby expose said second substrate surface portion.

* * * * *